United States Patent
Doi et al.

(10) Patent No.: US 8,335,290 B2
(45) Date of Patent: Dec. 18, 2012

(54) DATA RECEIVING CIRCUIT DETERMINING LOGIC OF INPUT SIGNAL BASED ON DIGITAL VALUE

(75) Inventors: Yoshiyasu Doi, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 484 days.

(21) Appl. No.: 12/555,904

(22) Filed: Sep. 9, 2009

(65) Prior Publication Data
US 2010/0061498 A1   Mar. 11, 2010

(30) Foreign Application Priority Data
Sep. 11, 2008   (JP) .................................. 2008-233915

(51) Int. Cl.
*H04L 7/00*   (2006.01)
*H03K 9/00*   (2006.01)

(52) U.S. Cl. ........................................ 375/371; 375/316

(58) Field of Classification Search .................. 375/316, 375/371, 354
See application file for complete search history.

(56) References Cited

U.S. PATENT DOCUMENTS
4,922,251 A * 5/1990 Ollendick ...................... 341/155
2008/0001806 A1 * 1/2008 Uchino .......................... 341/161

FOREIGN PATENT DOCUMENTS
JP   11-261408   9/1999
JP   2003-309543   10/2003
JP   2004-208222   7/2004

* cited by examiner

*Primary Examiner* — David C. Payne
*Assistant Examiner* — Brian J Stevens
(74) *Attorney, Agent, or Firm* — Fujitsu Patent Center

(57) ABSTRACT

A receiving circuit includes a clock generation circuit that generates a clock signal, an integration filter that stores a signal potential of an input signal and generates a first storage potential in a period in which the clock signal indicates one logic, a first analog-to-digital circuit that converts the first storage potential into a first digital value, and a data determination circuit that determines a logic of the input signal on a basis of the first digital value.

5 Claims, 10 Drawing Sheets

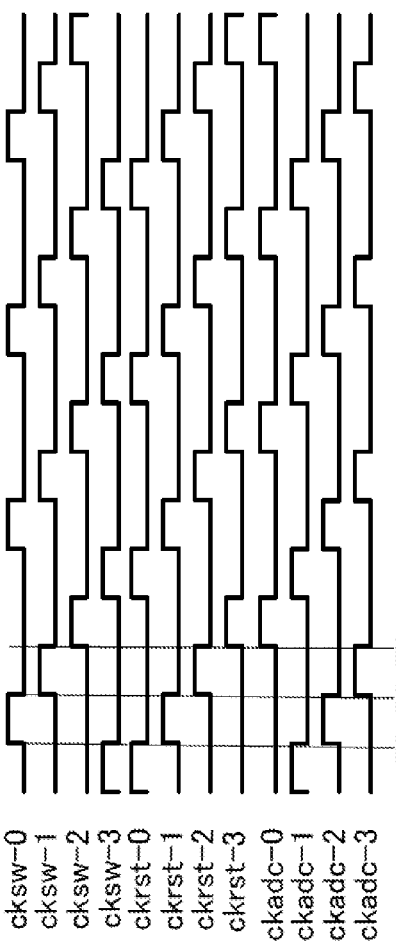
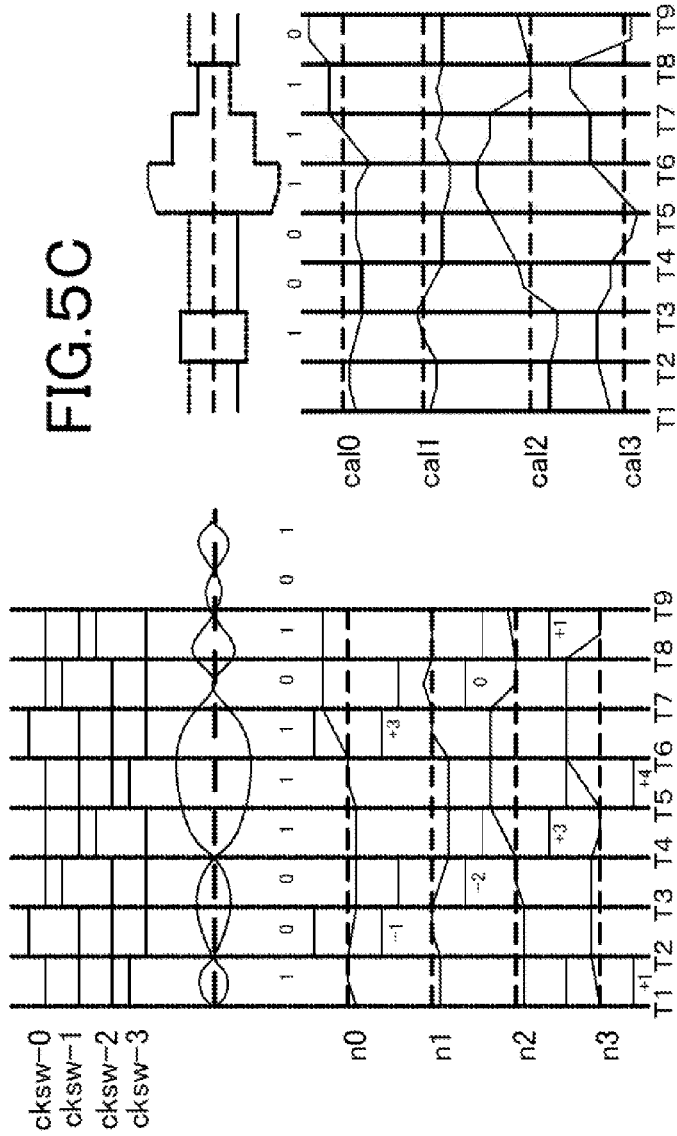
FIG.5A
FIG.5B
FIG.5C

DATA RECEIVING CIRCUIT DETERMINING LOGIC OF INPUT SIGNAL BASED ON DIGITAL VALUE

CROSS REFERENCE TO RELATED APPLICATION

This application is based upon and claims the benefit of priority from the prior Japanese Patent Application No. 2008-233915 filed on Sep. 11, 2008, the entire contents of which are incorporated herein by reference.

FIELD

The embodiments discussed herein are related to a data receiving circuit for determining a logic of received data signals.

BACKGROUND

With a trend toward an increasing data transfer rate of data signals, demands for a gigabit-class, high data-transfer rate exist not only in systems for communication backbones but also in systems for general consumers. In the systems for communication backbones, characteristics of transmission paths for transmitting data signals can be identified to some degrees and data transfer rates are also predetermined. Thus, the qualities of the data signal levels are substantially constant.

On the other hand, in the systems for general consumers, transmission paths have a wide variety of characteristics and various data transfer rates are also used. Thus, variations occur in the qualities of the data signal levels.

Typically, a reception apparatus for a high-speed data transfer rate has a section for detecting a data boundary portion in a data signal, a clock generation section for generating a clock corresponding to the data boundary, and a section for detecting a data signal level at the detected data boundary portion and a data signal level at a center portion of the data in accordance with the clock (e.g., refer to Japanese Laid-open Patent Publication Nos. 2003-309543 and 2004-208222.

The receiving apparatus has a analog-to-digital conversion circuit as the section for detecting the data signal level and further has a section for detecting a logic of the data signal on the basis of the data signal level.

With this configuration, when the quality of the data signal varies for each system, the result of the detection of the receiving apparatus also varies. This makes it difficult to detect the data boundary portion and to determine the logic of the data signal.

SUMMARY

According to one aspect of the embodiments, the receiving circuit includes: a clock generation circuit that generates a clock signal; an integration filter that stores a signal potential of an input signal and generates a first storage potential in a period in which the clock signal indicates one logic; an analog-to-digital circuit that converts the first storage potential into a first digital value; and a data determination circuit that determines a logic of the input signal on a basis of the first digital value.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIGS. 5A to 5C depict the operation of an arithmetic-operation circuit and control clocks for driving the receiving circuit depicted in FIG. 3;

DESCRIPTION OF EMBODIMENTS

A first embodiment, a second embodiment, a third embodiment, a fourth embodiment, and a fifth embodiment will be described below.

First Embodiment

Figure 1:
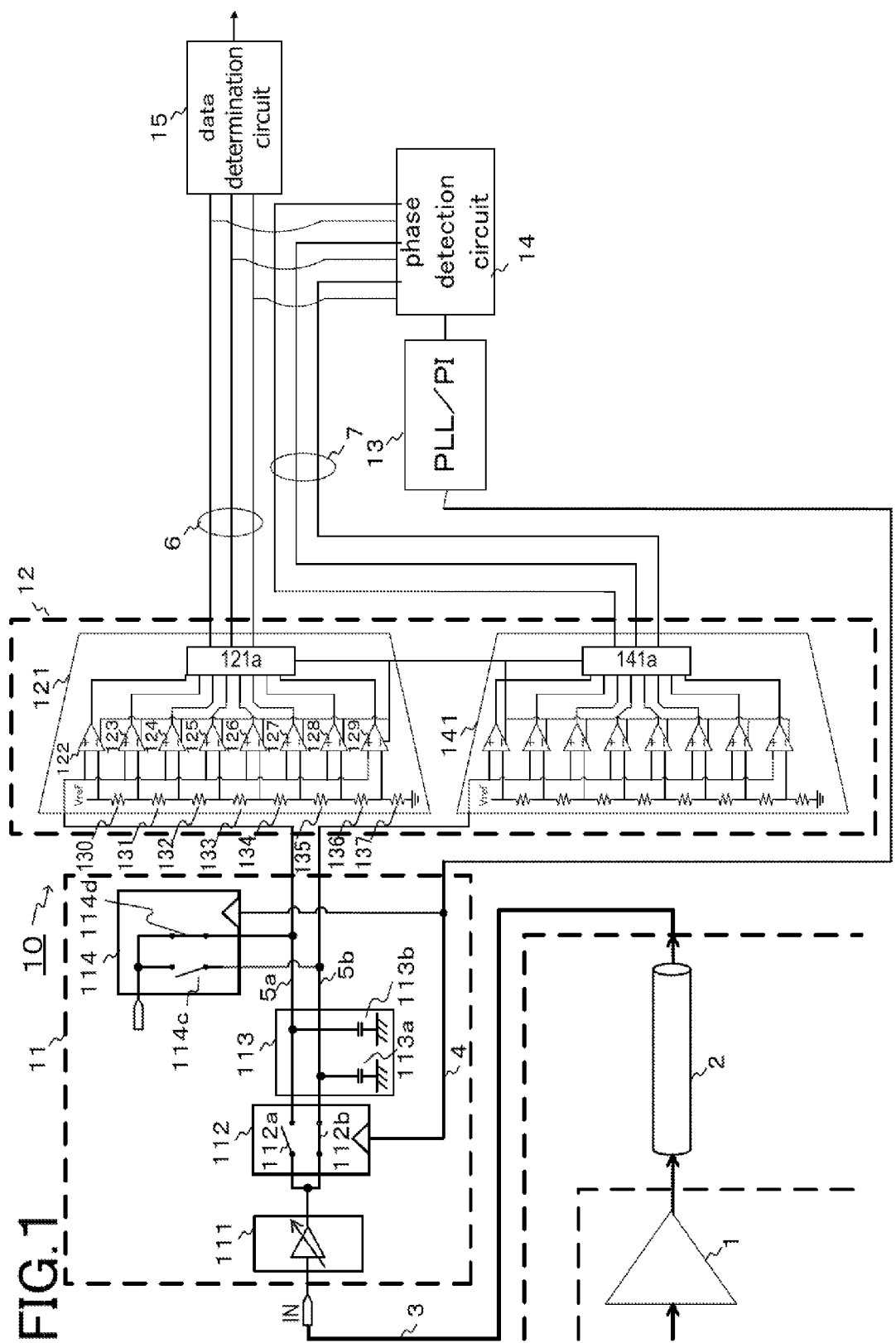
FIG. 1 depicts a data output buffer, a transmission path, and a receiving circuit according to a first embodiment.

FIG. 1 depicts a data output buffer 1, a transmission path 2, and a receiving circuit 10 according to a first embodiment. The data output buffer 1 is a buffer at a last stage provided in a data output circuit in a data transmitter. The transmission path 2 is used for transmitting a signal from the data transmitter to a receiver. A data signal 3 is output from the data output buffer 1 and is transmitted through the transmission path 2.

The receiving circuit 10 of the present embodiment includes an integration filter 11, an ADC circuit (analog-to-digital conversion circuit) 12, a PLL/PI circuit (phase-locked-loop/phase-interpolator circuit) 13, a phase detection circuit 14, and a data determination circuit 15.

The integration filter 11 includes a conversion circuit 111, a sampling circuit 112, an integration circuit 113, and a reset circuit 114. The integration filter 11 receives the data signal 3 and a clock signal 4 via input terminals.

The conversion circuit 111 supplies current corresponding to the signal level of the data signal 3 input via the corresponding input terminal.

The sampling circuit 112 has switches 112a and 112b. The switch 112a is put into a connected state in accordance with a first logic of the clock signal 4 and is put into a disconnected state in accordance with a second logic of the clock signal 4. In accordance with the logic of the clock signal 4, the switch 112b performs an operation that is opposite to the operation of the switch 112a. First ends of the switches 112a and 112b are connected to the same input terminal and second ends of the switches 112a and 112b are connected to respective different output terminals. The input terminal of the sampling circuit 112 receives current input from the conversion circuit 111. The clock signal 4 is supplied from the PLL/PI circuit 13.

The integration circuit 113 has first and second input terminals, first and second output terminals, a first line connecting the first input terminal and the first output terminal, a second line connecting the second input terminal and the second output terminal, a capacitance element 113a connected to the second line, and a capacitance element 113b connected to the first line. The capacitance element 113b has a capacitance that is similar to the capacitance of the capacitance element 113a.

The first input terminal is connected to the switch 112a and the second input terminal is connected to the switch 112b. The first output terminal outputs a data integration signal 5a and the second output terminal outputs a data-boundary integration circuit 5b.

The reset circuit 114 has switches 114c and 114d. The switch 114c is put into a connected state in accordance with the second logic of the clock signal 4 and is put into a disconnected state in accordance with the first logic of the clock signal 4. In accordance with the logic of the clock signal 4, the switch 114d performs an operation that is opposite to the operation of the switch 114c. First ends of the switches 114c and 114d are connected to the same output terminal and second ends of the switches 114c and 114d are connected to respective different input terminals.

The integration circuit 113 receives current corresponding to the signal level of the data signal 3 from the conversion circuit 111 in a data boundary period of the data signal 3 and in a data period of the data signal 3, the periods being indicated by the logics of the clock signal 4. As a result, the integration circuit 113 outputs, as the data integration signal 5a or the data-boundary integration circuit 5b, a voltage representing a result of integration of the potential levels of the data signal 3 in the periods indicated by the clock signal 4. The potential level of the data integration signal 5a stored in the capacitance element 113b in the integration circuit 113 in the data boundary period of the data signal 3, the data boundary period indicated by the logic of the clock signal 4, is reset by the reset circuit 114. The potential level of the data-boundary integration signal 5b stored in the capacitance element 113a in the integration circuit 113 in the data period of the data signal 3, the data period being indicated by the logic of the clock signal 4, is reset by the reset circuit 114.

The ADC circuit 12 includes analog-to-digital circuits 121 and 141.

The analog-to-digital circuit 121 has a data-signal input terminal for receiving the data integration signal 5a, three output terminals for outputting 3-bit digital signals corresponding to the signal level of the data integration signal 5a, a reference-voltage input terminal for receiving an input of a reference voltage (Vref), and a ground input terminal for receiving an input of a ground voltage. The analog-to-digital circuit 121 has resistors 130 to 137 connected in series between the reference-voltage input terminal and the ground input terminal. The analog-to-digital circuit 121 further has differential amplifiers 122 and 129. A first end of each of the differential amplifiers 122 to 129 is connected to the data-signal input terminal and a second end of each of the differential amplifiers 122 to 129 is connected to a corresponding node between two successive ones of the resistors 130 to 137. Each of the differential amplifiers 122 to 129 compares the magnitude of the potential level of the data integration signal 5a with the magnitude of a potential level of the corresponding node and outputs a signal having a logic corresponding to the magnitude. An analog-to-digital conversion circuit 121a has eight input terminals that receive signals output from the differential amplifiers 122 to 129, respectively. The analog-to-digital conversion circuit 121a outputs a 3-bit digital-data integration signal 6 corresponding to the number of logics "H" of an 8-bit signal.

Similarly to the analog-to-digital circuit 121, the analog-to-digital circuit 141 has a data-signal input terminal, three output terminals for outputting a 3-bit digital-data-boundary integration signal 7, a reference-voltage input terminal, and a ground input terminal. The data-boundary integration circuit 5b is input to the data-signal input terminal of the analog-to-digital circuit 141. The analog-to-digital circuit 141 has resistors 130 to 137, differential amplifiers 122 to 192, and an analog-to-digital conversion circuit 141a to constitute a circuit that is similar to the analog-to-digital circuit 121. The ADC circuit 12 outputs the 3-bit digital-data integration signal 6 associated with the data integration signal 5a and the 3-bit digital-data-boundary integration signal 7 associated with the data-boundary integration signal 5b.

The data determination circuit 15 determines that the logic in the data period of the data signal 3 is low, when a logic level indicated by the digital-data integration signal 7 is smaller than 0. The data determination circuit 15 determines that the logic in the data period of the data signal 3 is high, when a logic level indicated by the digital-data integration signal 7 is greater than or equal to 0.

The phase detection circuit 14 detects a difference between the phase of the clock signal 4 and the phase of the data signal 3 on the basis of the potential level of the digital-data integration signal 6 and the potential level of the digital-data-boundary integration signal 7.

The detection of the phase difference is performed as follows. First, a determination is made as to whether a digital value of a first digital-data integration signal 6 is greater or smaller than a mid-point digital value representing one-half the maximum value of the potential level of the signal output from the integration filter 11. Next, a determination is made as to whether a digital value of a next digital-data integration signal 6 is greater or smaller than the mid-point digital value. On the basis of the result of the determination, a determination is made as to whether or not the potential level changes from a large state to a small state or changes from a small state to a large state.

Subsequently, a determination is made as to whether or not a digital value of the digital-data-boundary integration signal 7 is larger than or smaller than the mid-point digital value.

When the digital value of the digital-data integration signal 6 change from a large state to a small state and the digital value of the digital-data-boundary integration signal 7 is in a large state, it is determined that the phase of the data signal 3 is ahead of the phase of the clock signal 4, and on the basis of the amount of difference, the degree of the phase difference is determined. Similarly, when the digital value of the digital-data integration signal 6 changes from a large state to a small state and the digital value of the digital-data-boundary integration signal 7 is in a small state, it is determined that the phase of the data signal 3 is behind the phase of the clock signal 4, and on the basis of the amount of difference, the degree of the phase difference is determined. When the digital value of the digital-data integration signal 6 changes from a small state to a large state and the digital value of the digital-data-boundary integration signal 7 is in a large state, it is determined that the phase of the data signal 3 is behind the phase of the clock signal 4, and on the basis of the amount of difference, the degree of the phase difference is determined. When the digital values of the digital-data integration signal 6 changes from a small state to a large state and the digital value of the digital-data-boundary integration signal 7 is in a small state, it is determined that the phase of the data signal 3 is ahead of the phase of the clock signal 4, and on the basis of the amount of difference, the degree of the phase difference is determined.

The phase detection circuit 14 generates an information signal indicating whether the phase is ahead or behind and indicating the degree of the phase difference and outputs the information signal to the PLL/PI circuit 13.

On the basis of the information signal, the PLL/PI circuit 13 adjusts a cycle (constituted by periods of logic "high" and periods of logic "low") of the clock signal 4 so that the cycle matches the repeated cycle of the data periods and the data boundary periods of the data signal 3. The PLL/PI circuit 13 outputs the clock signal 4 to the integration filter 11.

Figure 2:
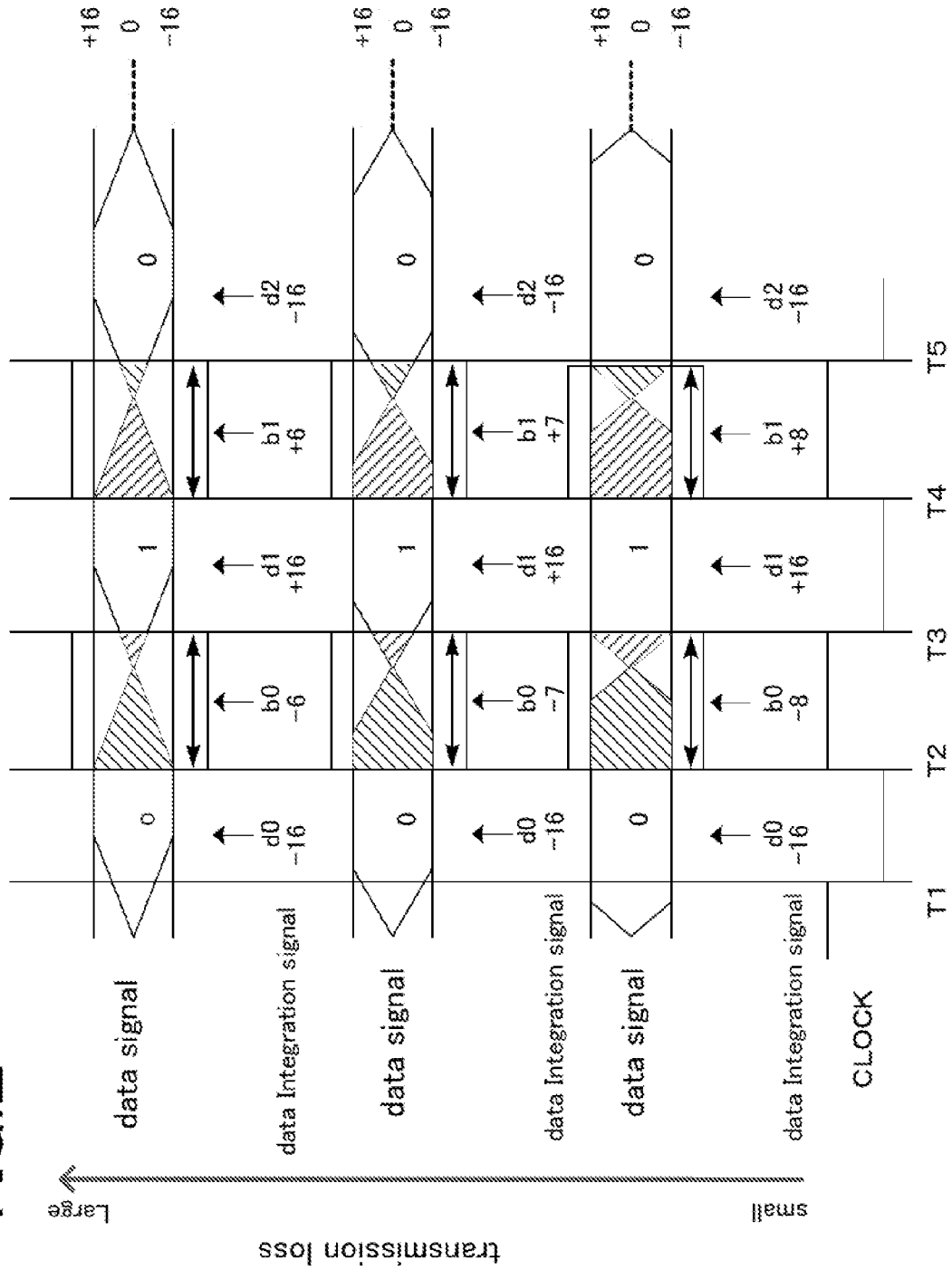
FIG. 2 illustrates details of operations of an integration filter and an ADC circuit.

FIG. 2 illustrates details of the operations of the integration filter 11 and the ADC circuit 12. In FIG. 2, the horizontal axis indicates passage of time, and T1, T2, T3, T4, and T5 indicate times. The vertical axis indicates, from the bottom, the clock signal 4, the data signal 3 for a small amount of transmission loss, the data signal 3 for a medium amount of transmission loss, and the data signal 3 for a large amount of transmission loss.

Potential levels that the ADC circuit 12 receives from the integration filter 11 are digitally expressed by −16 to 16, which are referred as "logic levels".

First, the operations of the integration filter 11 and the ADC circuit 12 will be described in conjunction with an example of the data signal 3 for a large amount of transmission loss. When the amount of transmission loss is large, the data signal 3 is greatly degraded in data boundary periods.

However, upon receiving the data signal 3, the integration filter 11 integrates the signal levels of the data signal 3 in a period (data period) of time T1 to time T2 in response to the clock signal 4. The logic of the data signal 3 is substantially low in a period (data period) of time T1 to time T2. Thus, the integration filter 11 outputs a data integration signal having a logic level of −16 at time T2.

In a period (data boundary period) of time T2 to time T3, the logic of the data signal 3 changes from low to high. Thus, at time T3, the integration filter 11 outputs a data-boundary integration signal indicating a logic level of −6 when it is converted into a digital data-boundary integration signal.

Thus, the data determination circuit 15 receives a digital-data integration signal 6 corresponding to a logic level of −16 at time T2.

Similarly, the logic of the data signal 3 is substantially high in a period (data period) of time T3 to time T4 and the logic of the data signal 3 changes from substantially high to low in a period (data boundary period) of time T4 to time T5. Thus, at time T4, the integration filter 11 outputs a data integration signal 5a having a logic level of 15, and at time T5, the integration filter 11 outputs a data-boundary integration signal 5b having a logic level of 6. At time T4, the data determination circuit 15 receives a digital-data integration signal 6 corresponding to a logic level of +16.

The reason why the logic level of the signal output from the integration filter 11 decreases is that, because of a large amount of degradation of the signal, the potential level of the data signal 3 decreases not only in the data boundary periods but also in the data periods. However, when the potential levels of the data signal 3 are integrated in the data period and the data boundary period to provide the logic level of the data integration signal 5a and the logic level of the data-boundary integration signal 5b, respectively, it is possible to determine the logic in the data period of the data signal 3, on the basis of the logic level of the data integration signal 5a.

That is, it is possible to determine that the logic of the data signal 3 in the period of time T1 to time T2 is low, on the basis of the logic level of the data integration signal 5a corresponding to the period of time T1 to time T2.

It is also possible to determine that the logic of the data signal 3 in the period of time T3 to time T4 is high, on the basis of the logic level of the data integration signal 5a corresponding to the period of time T3 to time T4.

When the amount of transmission loss is medium, the data signal 3 is degraded to a medium degree in the data boundary periods.

In the same manner described above, at time T2, the data determination circuit 15 receives a digital-data integration signal 6 indicating a logic level of −16. At time T4, the data determination circuit 15 receives a digital-data integration signal 6 indicating a logic level of +16. The reason why the logic level of the digital boundary integration signal 7 in the data boundary period increases is that the logic-changing period is reduced by the medium degree of degradation and the integration filter 11 receives the data signal 3 having a high logic level for a long period of time. As a result, as in the manner described, the data determination circuit 15 can determine the logic of the data signal 3.

When the amount of transmission loss is small, the amount of degradation of the data signal 3 is small in the data boundary periods.

Thus, at time T2, the data determination circuit 15 receives a digital-data integration signal 6 indicating a logic level of −16. At time T4, the data determination circuit 15 receives a digital-data integration signal 6 indicating a logic level of +16. The reason why the logic level of the digital boundary integration signal 7 in the data boundary period increases is that the logic-changing period is further reduced due to a small amount of degradation and the integration filter 11 receives the data signal 3 having a high logic level for a long period of time.

As a result, as in the manner described, the data determination circuit 15 can determine the logic of the data signal 3.

When the data signal 3 is degraded and the waveform quality is low due to introduction of noise or the like, a comparison between a result obtained when the logic level in the data boundary period of the data signal 3 at time T2 or time T4 is detected using only the ADC circuit 12 and a result obtained when the logic level in the data period of the data signal 3 at time T3 or time T5 is detected using only the ADC circuit 12 depicts no difference in some cases. This makes it difficult to determine the logic of the data signal 3.

However, according to the receiving circuit 10 of the first embodiment having the integration filter 11, the ADC circuit 12, the PLL/PI circuit 13, the phase detection circuit 14, and the data determination circuit 15, the integration filter 11 emphasizes the logic level of the data integration signal 5a to be received by the ADC circuit 12, to thereby facilitate the determination of the logic of the data signal 3. In addition, since the difference between the logic level indicated by the digital-data-boundary integration signal 7 and the logic level indicated by the digital-data integration signal 6 becomes large, the phase detection circuit 14 can increase the accuracy of matching between the repeated cycle of the data periods and the data boundary periods and the cycle of the clock signal generated by the PLL/PI circuit 13.

As a result, the receiving circuit 10 of the first embodiment can receive the data signal 3 even for a large amount of transmission loss in the signal transmission path, and also can receive data for various degrees of transmission loss in the transmission path.

Second Embodiment

Figure 3:
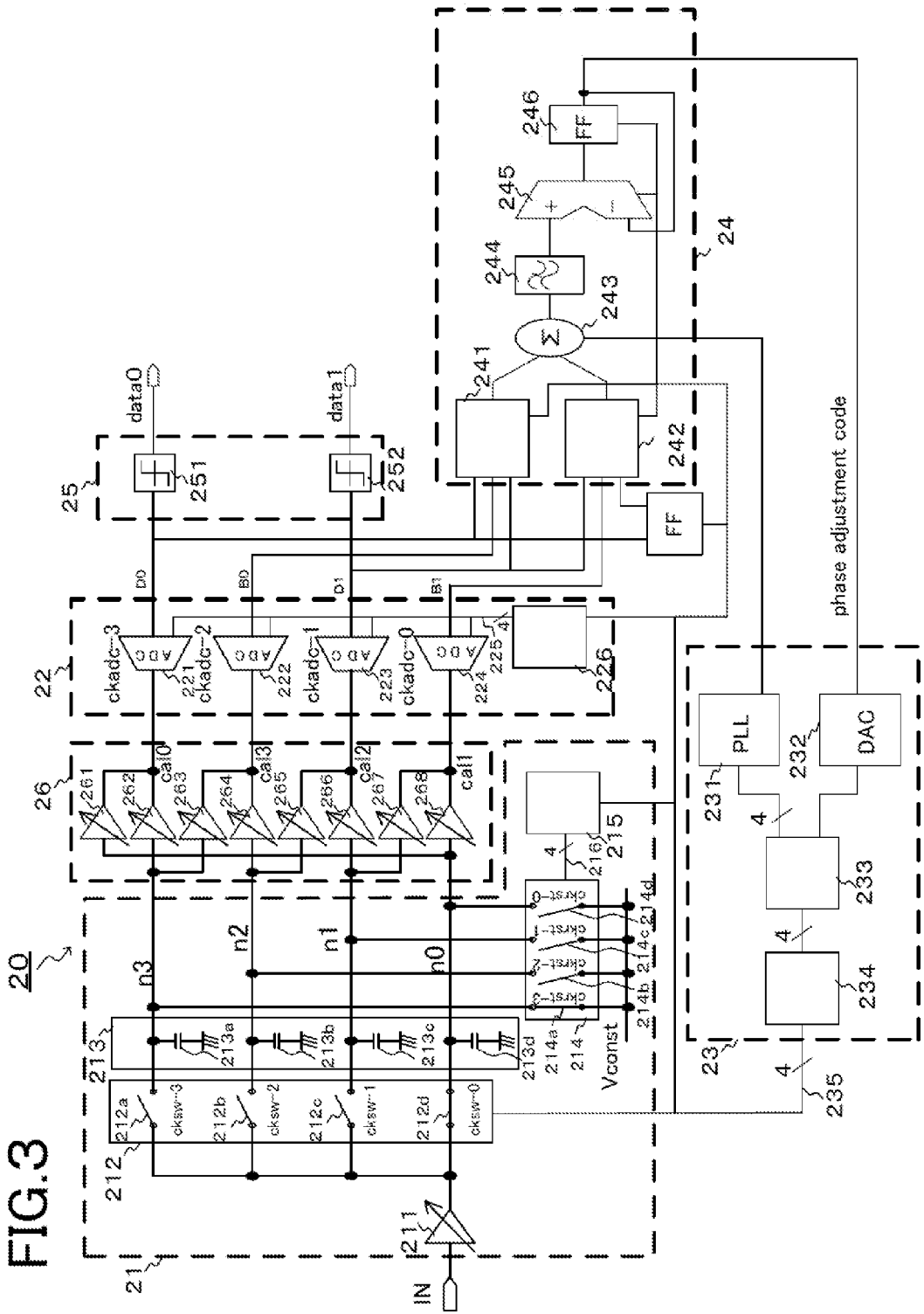
FIG. 3 depicts a receiving circuit according to a second embodiment.

FIG. 3 depicts a receiving circuit 20 according to a second embodiment. This receiving circuit 20 includes an integration filter 21, an ADC circuit 22, a clock generation circuit 23, a phase detection circuit 24, a data determination circuit 25, and an arithmetic-operation circuit 26.

The integration filter 21 includes a conversion circuit 211, a sampling circuit 212, an integration circuit 213, a reset circuit 214, and a clock generation circuit 215. The integration filter 21 receives a data signal 3 and a clock signal 4 via input terminals.

The conversion circuit 211 supplies current corresponding to the potential level of the data signal 3 input via the corresponding input terminal.

The sampling circuit 212 has switches 212a, 212b, 212c, and 212d that are put into connected states or disconnected states in accordance with one logic of a four-phase clock signal 235. First ends of the switches 212a, 212b, 212c, and 212d are connected to the same input terminal and second ends of the switches 212a, 212b, 212c, and 212d are connected to respective different output terminals. The input terminal receives current input from the conversion circuit 211. Each clock of the four-phase clock signal 235 has a cycle having two data periods and two data boundary periods, and has a logic "high" pulse in one-fourth the period of the cycle. The logic "high" pulses of the clocks that constitute the four-phase clock signal 235 are shifted from each other by 90°.

Thus, the switches 212a, 212b, 212c, and 212d in the sampling circuit 212 divide the data signal 3, input via the input terminal, into four periods for sampling.

The integration circuit 213 has four input terminals, four output terminals, four lines, and four capacitance elements 213a, 213b, 213c, and 213d. The four lines connect the input terminals and the output terminals, respectively. The four capacitance elements 213a, 213b, 213c, and 213d are connected to the corresponding lines and have similar capacitances.

The four input terminals are connected to the switches 212a, 212b, 212c, and 212d on a one-to-one basis. The four output terminals are connected to nodes n0, n1, n2, and n3, connected to four input terminals of the arithmetic-operation circuit 26, on a one-to-one basis.

The integration circuit 213 receives input current corresponding to the potential level of the data signal 3 at the input terminal in the pulse period of the clocks that constitute the four-phase clock signal 235, and consequently outputs signals having potential levels obtained by integrating the potential levels of the data signal 3.

The reset circuit 214 has four switches 214a, 214b, 214c, and 214d that connect a ground line (Vconst) and the four output terminals of the integration circuit 213. Each of the switches 214a, 214b, 214c, and 214d is connected or disconnected in response to a four-phase clock signal 216.

In response to the four-phase clock signal 235, the clock generation circuit 215 generates the four-clock signal 216 having phases that are different from those of the four-phase clock signal 235.

In a period when the integration of the levels of the input signal input via the input terminal is completed, the reset circuit 214 sequentially releases charges, stored in the four capacitance elements 213a, 213b, 213c, and 213d in the integration circuit 213, to ground, so that the integration circuit 213 is reset.

The arithmetic-operation circuit 26 has nodes cal0 to cal3 connected to the corresponding output terminals. The arithmetic-operation circuit 26 has amplifiers 261, 262, 263, 264, 265, 266, 267, and 268. The amplifier 261 is connected to the node n0 and outputs a potential level corresponding to the potential level of the node n0 to the node cal0. The amplifier 262 is connected to the node n3 and outputs a potential level corresponding to the potential level of the node n3 to the node cal0. The amplifier 263 is connected to the node n3 and outputs a potential level corresponding to the potential level of the node n3 to the node cal3. The amplifier 264 is connected to the node n2 and outputs a potential level corresponding to the potential level of the node n2 to the node cal3. The amplifier 265 is connected to the node n2 and outputs a potential level corresponding to the potential level of the node n2 to the node cal2. The amplifier 266 is connected to the node n0 and outputs a potential level corresponding to the potential level of the node n0 to the node cal2. The amplifier 267 is connected to the node n0 and outputs a potential level corresponding to the potential level of the node n0 to the node cal1. The amplifier 268 is connected to the node n0 and outputs a potential level corresponding to the potential level of the node n0 to the node cal1. That is, the potential level of the output signal of the amplifier 261 and the potential level of the output signal of the amplifier 262 are added at the node cal0. Similarly, the potential levels of the output signals of the amplifiers 263 and 264 are added at the node cal3. The potential levels of the output signals of the amplifiers 265 and 266 are added at the node cal2. The potential levels of the output signals of the amplifiers 267 and 268 are added at the node cal1.

Gains of the amplifiers 261 and 262 are set so that the potential V(cal0) of the node cal0 satisfies:

$$V(cal0)=V(n0)-V(n3)\times\tfrac{1}{2}.$$

Similarly, gains of the amplifiers 263 and 264 are set so that the potential V(cal3) of the node cal3 satisfies:

$$V(cal3)=V(n3)-V(n2)\times\tfrac{1}{2}.$$

Gains of the amplifiers 265 and 266 are set so that the potential V(cal2) of the node cal2 satisfies:

$$V(cal2)=V(n2)-V(n1)\times\tfrac{1}{2}.$$

Gains of the amplifiers 267 and 268 are set so that the potential V(cal1) of the node cal1 satisfies:

$$V(cal1)=V(n1)-V(n0)\times\tfrac{1}{2}.$$

The ADC circuit 22 includes analog-to-digital circuits 221, 222, 223, and 224 and a clock generation circuit 226. The analog-to-digital circuit 221 is connected to the node cal0 of the arithmetic-operation circuit 26, receives one clock of a four-phase clock signal 225 output from the clock generation circuit 226, converts the potential level of the node cal0 into a digital signal D0, and outputs the digital signal D0. Similarly, the analog-to-digital circuits 222, 223, and 224 are connected to the nodes cal3, cal2, and cal1, converts the potential levels of the output terminals cal3, cal2, and cal1 into digital signals B0, D1, and B1, and outputs the digital signals B0, D0, and B1, respectively. The digital signals D0 and D1 have logic levels in the data periods of the input signal input via the input terminal, and the digital signals B0 and B1 have logic levels in the data boundary periods. The clock generation circuit 226 receives the four-phase clock signal 235 and outputs the four-phase clock signal 225 having phases that are different from those of the four-phase clock signal 235.

The data determination circuit 25 has determination circuits 251 and 252. The determination circuit 251 determines a logic of the input signal in the data period, on the basis of the digital signal D0. The determination circuit 252 determines a logic of the input signal in the data period, on the basis of the digital signal D1. When the logic level in the data period is smaller than 0, it is determined that the logic level is "low", and when the logic level in the data period is greater than 0, it is determined that the logic level is "high".

The phase detection circuit 24 includes phase-difference detection circuits 241 and 242, a phase-difference-information combining circuit 243, a high-frequency filter 244, a phase-adjustment-code output circuit 245, and a phase-adjustment-code latch circuit 246.

Thus, the phase detection circuit 24 detects a difference between the phase of the four-phase clock signal 235 and the phase of the digital signals D0, D0, B0, and B1 and outputs a phase adjustment code to the clock generation circuit 23.

The phase-difference detection circuit 241 detects a difference between the phase of each of the digital signals D0, B0, and D1 and the phase of a corresponding one of the clocks of the four-phase clock signal 235.

The phase-difference detection circuit 242 detects a difference between the phase of each of the digital signals D0, D1, and B1 and the phase of a corresponding one of the clocks of the four-phase clock signal 235.

The detection of the phase differences will now be described in conjunction with an example of the phase-difference detection circuit 241. The phase-difference detection circuit 242 also performs phase difference detection in the same manner. First, a determination is made as to whether or not a digital value of the first digital signal D0 is greater or smaller than a mid-point digital value representing one-half the maximum value of the potential level of the signal output from the integration filter 21.

Next, a determination is made as to whether or not a digital value of the next digital signal D1 is greater or smaller than the mid-point digital value. On the basis of the result, a determination is made as to whether or not the potential level changes from a large state to a small state or changes from a small state to a large state.

Next, a determination is made as to whether or not a digital value of the digital signal B0 is greater or smaller than the mid-point digital value.

When the digital value of the digital signal D0 changes from a large state to a small state and the digital value of the digital signal B0 is in a large state, it is determined that the phase of the data signal 3 is ahead of the phase of the clock signal 4, and on the basis of the amount of difference, the degree of the phase difference is determined. Similarly, when the digital value of the digital signal D0 changes from a large state to a small state and the digital value of the digital-data-boundary integration signal B0 is in a small state, it is determined that the phase of the data signal 3 is behind the phase of the clock signal 4, and on the basis of the amount of difference, the degree of the phase difference is determined. When the digital value of the digital signal D0 changes from a small state to a large state and the digital value of the digital data signal B0 is in a large state, it is determined that the phase of the data signal 3 is behind the phase of the clock signal 4, and on the basis of the amount of difference, the degree of the phase difference is determined. When the digital value of the digital signal D0 changes from a small state to a large state and the digital value of the digital signal B0 is in a small state, it is determined that the phase of the data signal 3 is ahead of the phase of the clock signal 4, and on the basis of the amount of difference, the degree of the phase difference is determined.

Each of the phase-difference detection circuits 241 and 242 generates an information signal indicating whether the phase is ahead or behind and indicating the degree of the phase difference and outputs the information signal to the phase-difference-information combining circuit 243.

The phase-difference-information combining circuit 243 combines the phase differences detected by the phase-difference detection circuits 241 and 242 and outputs a combined phase-difference signal.

That is, the phase-difference-information combining circuit 243 detects a difference between the phases of the digital signals D0, B0, and D1 and the phase of one clock of the four-phase clock signal 235.

The high-frequency filter 244 eliminates high-frequency components from the combined phase-difference signal. The phase-adjustment-code latch circuit 246 latches the present phase adjustment code.

The phase-adjustment-code output circuit 245 adds information of the combined phase-difference signal to the present phase adjustment code to be latched by the phase-adjustment-code latch circuit 246, to thereby generate a next phase adjustment code. The phase adjustment code is output to the clock generation circuit 23.

The clock generation circuit 23 includes a PLL circuit 231, a DAC (digital-analog converter) 232, an arbitrary-phase generation circuit 233, and a pulse-clock generation circuit 234.

The PLL circuit 231 receives the information signal from the phase-difference-information combining circuit 243 and generates a clock signal having a cycle that matches the repeated cycle of the data periods and the data boundary periods of the input signal.

The DAC 232 receives the phase adjustment code output from the phase-adjustment-code latch circuit 246, and outputs a phase instruction signal (analog signal) for causing the arbitrary-phase generation circuit 233 to generate phases.

The arbitrary-phase generation circuit 233 receives the phase instruction signal (analog signal) generated by the DAC 232 and generates clocks having arbitrary phases in accordance with the potential of the received phase instruction signal. One example of a circuit for generating arbitrary phases is disclosed in Japanese Laid-open Patent Publication No. 11-261408.

The pulse-clock generation circuit 234 generates pulse clocks from the clocks generated by the arbitrary-phase generation circuit 233.

Figure 4:
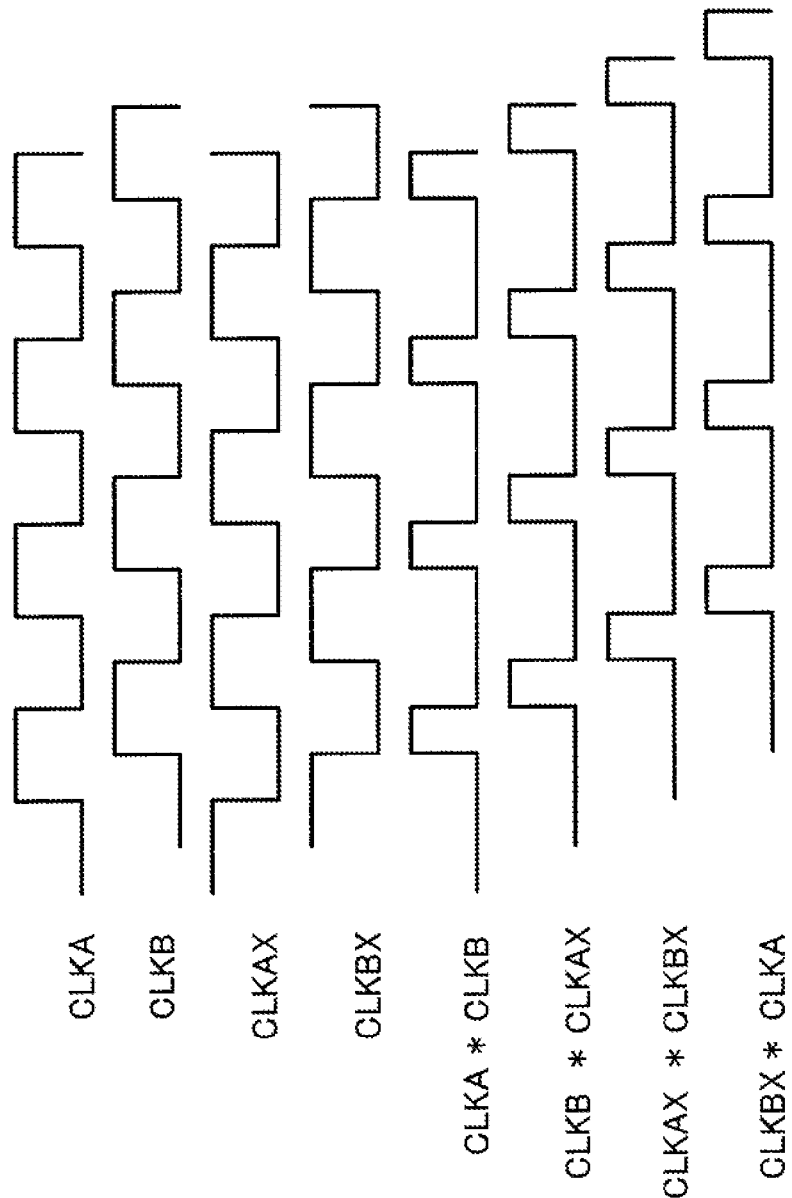
FIG. 4 illustrates clocks and pulse clocks generated by a clock generation circuit depicted in FIG. 3.

FIG. 4 illustrates the clocks and the pulse clocks generated by the clock generation circuit 23. The arbitrary-phase generation circuit 233 generates clocks CLKA, CLKAX, CLKB, and CLKBX having phases that are different from each other by 90°. The clock CLKA rises from logic "low" to logic "high" at a phase determined according to the potential of the phase instruction signal from the DAC 232. The clock CLKAX is an inverted clock of the clock CLKA. The clock CLKB rises from logic "low" to logic "high" with a delay of 90° from the clock CLKA. The clock CLKBX is an inverted clock of the clock CLKB.

The pulse-clock generation circuit 234 generates pulse clock signals CLKA*CLKB, CLKAX*CLKB, CLKAX*CLKBX, and CLKA*CLKBX. The pulse clock signal CLKA*CLKB is obtained by performing logical AND on the clock CLKA and the clock CLKB. The pulse clock signal CLKAX*CLKB is obtained by performing logical AND on the clock CLKAX and the clock CLKB. The pulse clock signal CLKAX*CLKBX is obtained by performing logical AND on the clock CLKAX and the clock CLKBX. The pulse clock signal CLKA*CLKBX is obtained by performing logical AND on the clock CLKA and the clock CLKBX.

As a result, the pulse clock signals CLKA*CLKB, CLKAX*CLKB, CLKAX*CLKBX, and CLKA*CLKBX constitute a four-phase clock pulse signal having phases that are sequentially shifted by 90°. The pulse width of each of the pulse clocks is about one-fourth the cycle of the clock CLKA.

FIGS. 5A to 5C depict the operation of the arithmetic-operation circuit 26 and control clocks for driving the receiving circuit 20. FIG. 5A depicts the relationships among the phases of the control clocks, i.e., the four-phase clock signal 235 for the sampling circuit 212, the four-phase clock signal 216 for the reset circuit 214, and the four-phase clock signal 225 for the ADC circuit 22. The four-phase clock signal 235 for the sampling circuit 212 is constituted by signals CKSW-0, CKSW-1, CKSW-2, and CKSW-3. The signals CKSW-0, CKSW-1, CKSW-2, and CKSW-3 correspond to the pulse clock signals CLKA*CLKB, CLKAX*CLKB, CLKAX*CLKBX, and CLKA*CLKBX, respectively.

The four-phase clock signal 216 for the reset circuit 214 is constituted by signals CKRST-0, CKRST-1, CKRST-2, and CKRST-3. The phases of the signals CKRST-0, CKRST-1, CKRST-2, and CKRST-3 are 90° ahead of the phases of the signals CKSW-0, CKSW-1, CKSW-2, and CKSW-3, respectively, and have a pulse width that is similar to the pulse width thereof.

The four-phase clock signal 225 for the ADC circuit 22 is constituted by signals CKADC-0, CKADC-1, CKADC-2, and CKADC-3. The pulses of the signals CKADC-0, CKADC-1, CKADC-2, and CKADC-3 are 90° ahead of the pulses of the signals CKRST-0, CKRST-1, CKRST-2, and CKRST-3, and have a pulse width that is similar the pulse width thereof.

FIGS. 5B and 5C illustrate the operation of the arithmetic-operation circuit 26. In this case, the nodes n0, n1, n2, and n3 are connected to the capacitance elements 213d, 213c, 213b, and 213a of the integration circuit 213. The arithmetic-operation circuit 26 outputs arithmetic-operation results about the nodes n3, n2, n1, and n0 to the corresponding nodes cal0, cal3, cal2, and cal1.

Thus, since the logics of the four-phase clock signals 235, 216, and 225 change as described above, the receiving circuit 20 operates as follows.

The operation will be described with reference to the node n3 depicted in FIG. 5B. First, when the logic of the signal CKRST-3 becomes low, the state of the integration circuit 213 changes from a reset state to a state in which the capacitance element 213a can perform integration of the signal from the conversion circuit 211. The signal from the conversion circuit 211 has a logic level of 1, which is logic "high". Subsequently, the logic of the signal CSKW-3 becomes high to close the switch 212a of the sampling circuit 212, so that the capacitance element 213a in the integration circuit 213 starts integration of the signal. Next, the logic of the signal CKSW-3 becomes low to open the switch 212a of the sampling circuit 212, so that the capacitance element 213a in the integration circuit 213 finishes the integration of the signal. As a result, at time T2, a logic level "+1" resulting from the integration of the signal is stored at the node n3 of the integration filter 21.

The operation will further be described with reference to the node n0 depicted in FIG. 5B. In a period of time T2 to time T3, the signal from the conversion circuit 211 has a logic level of −1, which is logic "low". Since the signal CKSW-0 is a pulse signal that becomes logic "high", the capacitance element 213d in the integration circuit 213 receives a signal having logic "low", which is a logic level of −1. As a result, at time T3, the node n0 has a logic level of −1.

The operation will further be described with reference to the nodes n3 and n0 depicted in FIG. 5B and the node cal0 depicted in FIG. 5C. Next, the arithmetic-operation circuit 26 performs an arithmetic operation for subtracting one-half the logic level "+1" of the node n3, the logic level "+1" being obtained from the charge stored in the capacitance element 213a, from the logic level "−1" of the node n0. At time t3, the arithmetic-operation circuit 26 outputs, to the node cal0, a signal having a logic level of −1.5 resulting from the arithmetic operation.

Next, the analog-to-digital circuit 221 in the ADC circuit 22 operates in response to the pulse signal CKADC-3 having logic "H", so that the logic level of the node cal0 of the arithmetic-operation circuit 26 is converted into a digital signal D0.

Similarly, referring to the nodes n0 and n1 depicted in FIG. 5B and the node cal1 depicted in FIG. 5C, at time T3, the signal logic level "−1" resulting from the integration performed by the capacitance element 213d is stored at the node n0. At time T4, a signal logic level "−2" resulting from the integration performed by the capacitance element 213c is stored at the node n1. Referring to FIG. 5B, at time T4, a logic level "−1.5" obtained by subtracting one-half the logic level "−1" of the node n0 from the logic level "−2" of the node n0 appears at the node cal1 of the arithmetic-operation circuit 26.

Similarly, referring to the nodes n1 and n2 depicted in FIG. 5B and the node cal2 depicted in FIG. 5C, at time T4, the signal logic level "−2" resulting from the integration performed by the capacitance element 213c is stored at the node n1. At time T5, a signal logic level "3" resulting from the integration performed by the capacitance element 213b is stored at the node n2. Referring to FIG. 5B, at time T5, a logic level "4" obtained by subtracting one-half the logic level "−2" of the node n1 from the logic level "3" of the node n2 appears at the node cal2 of the arithmetic-operation circuit 26.

Similarly, referring to the nodes n2 and n3 depicted in FIG. 5B and the node cal3 depicted in FIG. 5C, at time T5, the signal logic level "3" resulting from the integration performed by the capacitance element 213b is stored at the node n2. At time T6, a signal logic level "4" resulting from the integration performed by the capacitance element 213a is stored at the node n3. Referring to FIG. 5B, at time T6, a logic level "+2.5" obtained by subtracting one-half the logic level "3" of the node n2 from the logic level "+4" of the node n3 appears at the node cal3 of the arithmetic-operation circuit 26.

The arithmetic-operation circuit 26 performs an arithmetic operation for subtracting one-half the logic level of the data stored earlier by 90° from the logic level of the data stored by the integration circuit 213. Thus, when the logic of the data signal 3 changes, the logic level obtained by the integration in the data period is emphasized. On the other hand, when the logic of the data signal 3 does not change, the logic level obtained by the integration in the data period is reduced.

Such an operation is performed for the following reason. First, one cycle of the data signal 3 is associated with phases of 0° to 360° and is constituted by two data boundary periods and two data periods. Thus, each of the data boundary periods and the data periods corresponds to a phase of 90°.

That is, the arithmetic-operation circuit 26 subtracts one-half the logic level obtained by integration of the data signal 3 in the data period from the logic level obtained by integration of the data signal 3 in the data period or subtracts one-half the logic level obtained by integration of the data signal 3 in the data boundary period from the logic level obtained by integration of the data signal 3 in the data period.

In this case, when the logic of the data signal 3 changes, the absolute value of the logic level obtained by the integration of the data signal 3 in the data boundary period is small. Since the logic of the data signal 3 does not change greatly, the absolute value of the logic level obtained by the integration of the data signal 3 in the data period is large. When the logic of the data signal 3 does not change, the absolute value of the logic level obtained by the integration of the data signal 3 in the data boundary period and the absolute value of the logic level obtained by the integration of the data signal 3 in the data period are substantially equal to each other.

When the logic of the data signal 3 changes, the sign of the polarity of the logic level obtained by the integration of the data signal 3 in the data boundary period and the sign of the polarity of the logic level obtained by the integration of the data signal 3 in the data period subsequent to the data boundary period are opposite to each other.

That is, when the logic of the data signal 3 does not change, a logic level having the same sign is subtracted and thus the logic level obtained by the integration of the data signal 3 is attenuated. On the other hand, when the logic of the data signal 3 changes, the logic level having the opposite sign is subtracted although the absolute value of the logic level is small and thus the logic level obtained by the integration of the data signal 3 is increased. That is, the logic level is emphasized.

With this arrangement, when the amount of transmission loss is large and the data signal 3 is degraded, a signal that is less degraded because of the emphasis of the signal at a logic change point is input to the ADC circuit 22. On the other hand, when the amount of transmission loss is small and the data signal 3 is not degraded, a more degraded signal than its original signal is input to the ADC circuit 22 because of the signal attenuation that occurs when the logic does not change. That is, regardless of the signal input to the receiving circuit 20, a signal having a certain amount of degradation is input to the ADC circuit 22.

Thus, the receiving circuit 20 of the second embodiment can receive data for various degrees of transmission loss in the transmission path.

Third Embodiment

Figure 6:
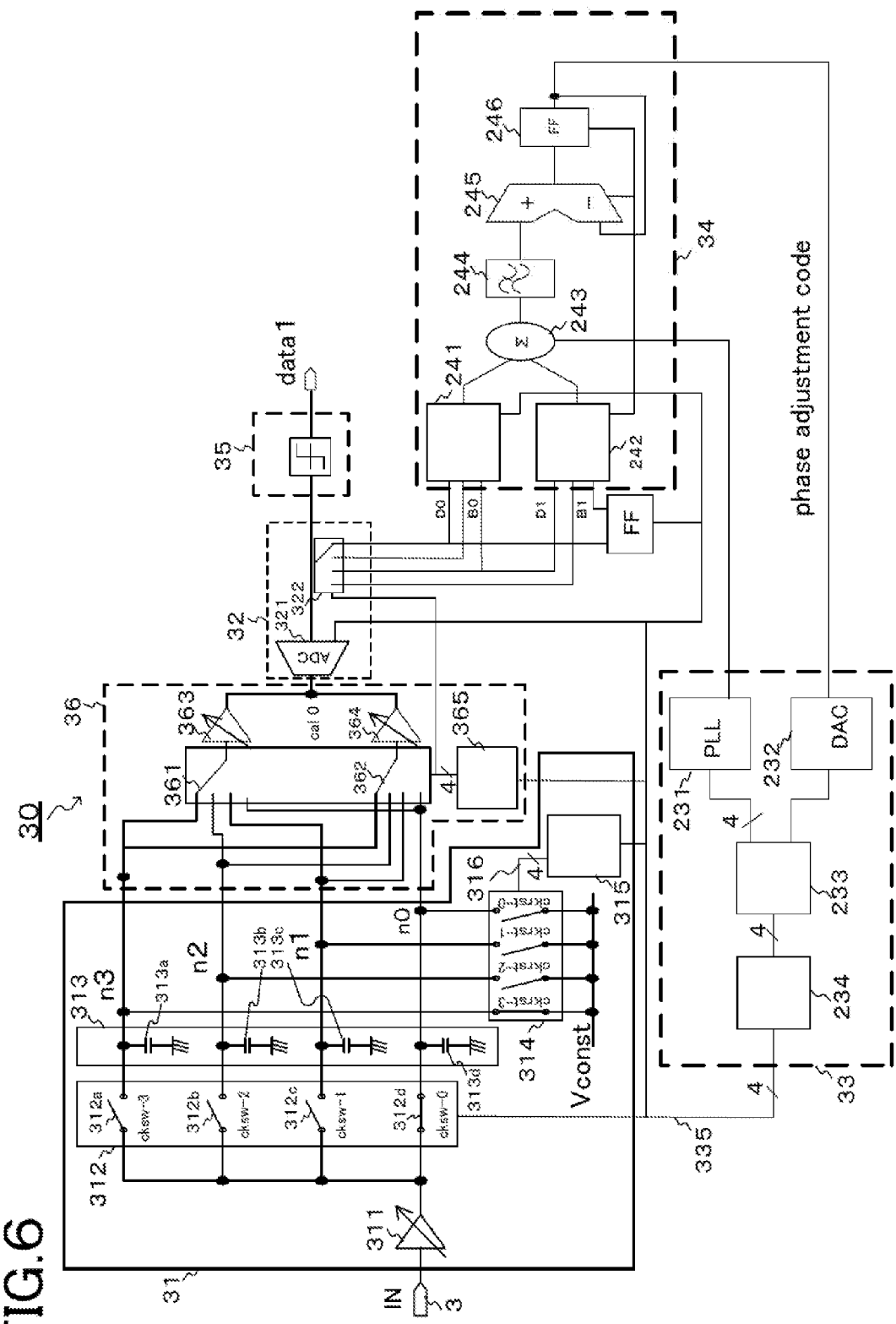
FIG. 6 depicts a receiving circuit according to a third embodiment.

FIG. 6 depicts a receiving circuit 30 according to a third embodiment. This receiving circuit 30 includes an integration filter 31, an ADC circuit 32, a clock generation circuit 33, a phase detection circuit 34, a data determination circuit 35, and an arithmetic-operation circuit 36.

The clock generation circuit 33 and the phase detection circuit 34 are similar to the clock generation circuit 23 and the phase detection circuit 24, respectively. The data determination circuit 35 is similar to the determination circuit 251.

The integration filter 31 includes a conversion circuit 311, a sampling circuit 312, an integration circuit 313, a reset circuit 314, and a clock generation circuit 315. The integration filter 31 receives a data signal 3 and a clock signal 4 via input terminals.

Similarly to the conversion circuit 211, the conversion circuit 311 supplies current corresponding to the signal level of the data signal 3 input via the corresponding input terminal.

The sampling circuit 312 has a configuration that is similar to that of the sampling circuit 212 and performs operation that is similar to the operation thereof. That is, the sampling circuit 312 has switches 312a, 312b, 312c, and 312d that are put into connected or disconnected states in accordance with one logic of a four-phase clock signal 335. First ends of the switches 312a, 312b, 312c, and 312d are connected to the same input terminal and second ends of the switches 312a, 312b, 312c, and 312d are connected to respective different output terminals. The sampling circuit 312 samples the data signal 3 input via the input terminal, in accordance with the four-phase clock signal 335.

The integration circuit 313 is similar to the integration circuit 213, and has four input terminals, four output terminals, four lines, and four capacitance elements 313a, 313b, 313c, and 313d. The four lines connect the input terminals and the output terminals, respectively. The four capacitance elements 313a, 313b, 313c, and 313d are connected to the corresponding lines and have similar capacitances.

The four input terminals are connected to the corresponding switches 312a, 312b, 312c, and 312d on a one-to-one basis. The four output terminals are connected to corresponding nodes n0, n1, n2, and n3, which are connected to four input terminals of the arithmetic-operation circuit 36, on a one-to-one basis.

The integration circuit 313 integrates the levels of the data signal 3, input via the input terminal, in a pulse period of clocks that constitute the four-phase clock signal 335.

The reset circuit 314 is similar to the reset circuit 214, and has four switches 314a, 314b, 314c, and 314d that connect a ground line (Vconst) and the four output terminals of the integration circuit 313. Each of the switches 314a, 314b, 314c, and 314d is connected or disconnected in response to a four-phase clock signal 316. In response to the four-phase clock signal 335, the clock generation circuit 315 generates the four-clock signal 316 having phases that are different from those of the four-phase clock signal 335.

In a period when the integration of the levels of the data signal 3 input via the input terminal is completed, the reset circuit 314 sequentially releases charges, stored in the four capacitance elements 313a, 313b, 313c, and 313d in the integration circuit 313, to ground (Vconst), so that the integration circuit 313 is reset.

The ADC circuit 32 has an analog-to-digital circuit 321 and a switch circuit 322. Since the analog-to-digital circuit 321 is similar to the analog-to-digital circuit 221, a description thereof is not given hereinbelow. The switch circuit 322 connects the output terminal of the analog-to-digital circuit 321 and a terminal of the phase detection circuit 34 in response to a four-phase clock signal (constituted by Vga0-SW0, Vga0-SW1, Vga0-SW2, and Vga0-SW3) output from a clock generation circuit 365. The switch circuit 322 outputs signals D0, B0, D0, and B1 so as to correspond to the clock signals Vga0-SW0, Vga0-SW1, Vga0-SW2, and Vga0-SW3.

The arithmetic-operation circuit 36 has a node cal0, amplifiers 363 and 364, switches 361 and 362, and a clock generation circuit 365. The node cal0 is connected to the nodes n0, n1, n2, and n3, connected to the input terminal, and is connected to an output terminal. Each of the switches 361 and 362 has four input terminals and one output terminal.

The amplifier 363 is connected to the output terminal of the switch 361, and outputs, to the output terminal cal0, a potential level that is one-half the potential level of the node n0, n1, n2, or n3 connected to the input terminal and that has an opposite sign. The amplifier 364 is connected to the output terminal of the switch 362, and directly outputs, to the node cal0 connected to the output terminal, the potential level of the node n0, n1, n2, or n3 connected to the input terminal. The switches 361 and 362 repeatedly perform the following operations. In a first operation, when the switch 361 connects the node n3 and the amplifier 363, the switch 362 connects the node n0 and the amplifier 364. In a second operation, when the switch 361 connects the node n0 and the amplifier 363, the switch 362 connects the node n0 and the amplifier 364. In a third operation, when the switch 361 connects the node n0 and the amplifier 363, the switch 362 connects the node n2 and the amplifier 364. In a fourth operation, when the switch 361 connects the node n2 and the amplifier 363, the switch 362 connects the input terminal n3 and the amplifier 364. The operation then returns to the first operation.

The clock generation circuit 365 outputs the clock signals Vga0-SW0, Vga0-SW1, Vga0-SW2, and Vga0-SW3 for causing the switch 361 to perform connection/disconnection operations as described above and outputs clock signals Vga1-SW0, Vga1-SW1, Vga1-SW2, and Vga1-SW3 for causing the switch 362 to perform connection/disconnection operations as described above.

Figure 7A:
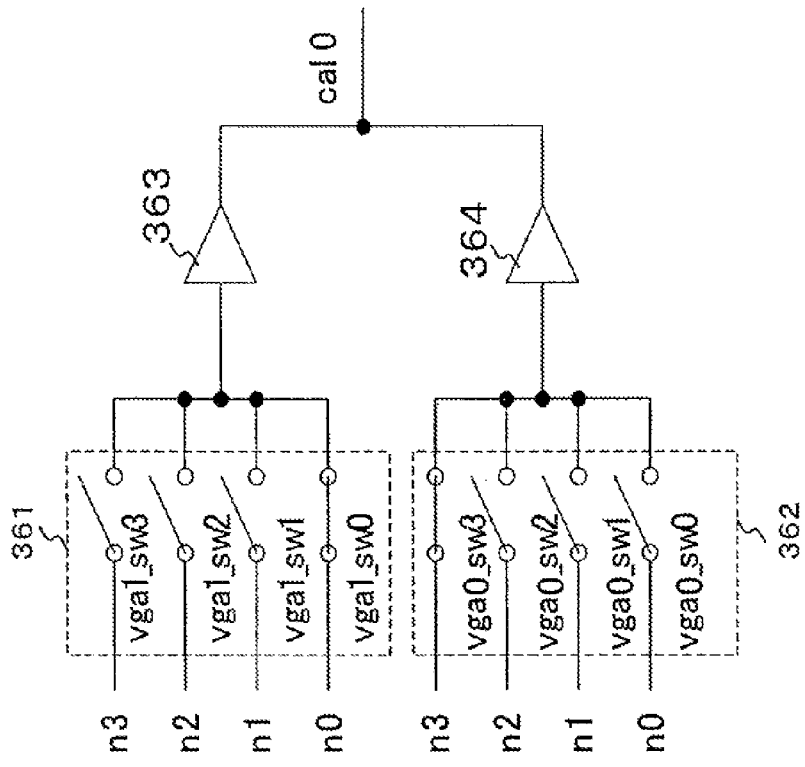
FIGS. 7A and 7B illustrate details of clock signals generated by a clock generation circuit depicted in FIG. 6.
Figure 7B:
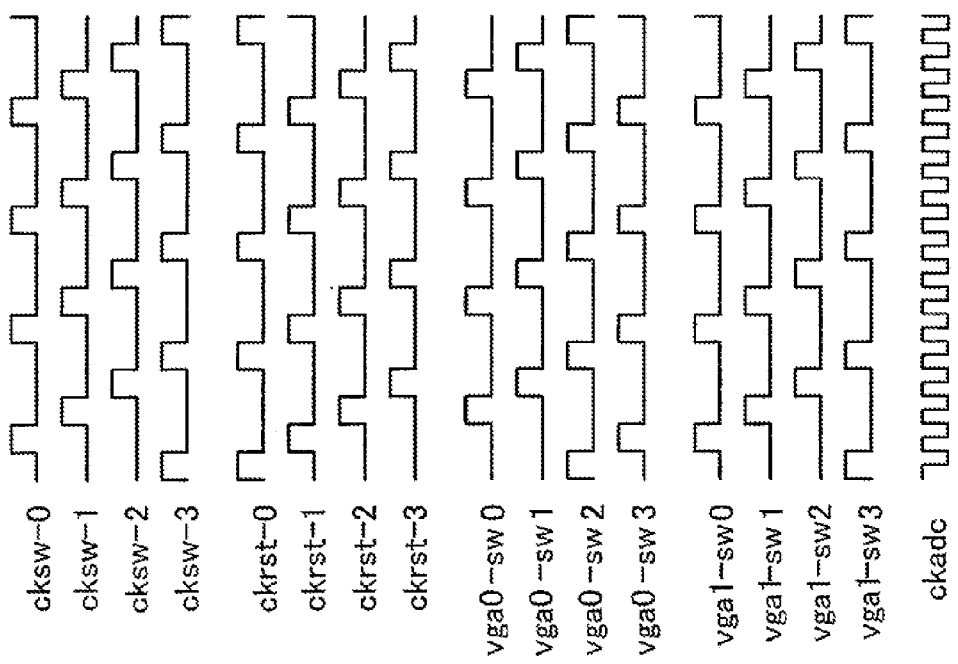

FIGS. 7A and 7B illustrate details of clock signals generated by the clock generation circuit 365. Clock signals CKSW-0, CKSW-1, CKSW-2, CKSW-3, CKRST-0, CKRST-1, CKRST-2, and CKRST-3 depicted in FIG. 7A are similar to those having the same reference characters depicted in FIG. 5A.

The clock signals Vga1-SW0, Vga1-SW1, Vga1-SW2, and Vga1-SW3 are similar to the clock signals CKSW-0, CKSW-1, CKSW-2, and CKSW-3.

The clock signals Vga0-SW0, Vga0-SW1, Vga0-SW2, and Vga0-SW3 have phases that are delayed by 90° from the clock signals CKSW-0, CKSW-1, CKSW-2, and CKSW-3. That is, the times at which the logics of the clock signals Vga0-SW0, Vga0-SW1, Vga0-SW2, and Vga0-SW3 rise from "low" to "high" are delayed by 90° from the times at which the logics of the clock signals CKSW-0, CKSW-1, CKSW-2, and CKSW-3 rise.

FIG. 7B depicts the switches 361 and 362 and the amplifiers 363 and 364 included in the arithmetic-operation circuit 36 depicted in FIG. 6. The clock signals Vga1-SW0, Vga1-SW1, Vga1-SW2, and Vga1-SW3 are input to the switch 361. The logics of the clock signals Vga1-SW0, Vga1-SW1, Vga1-SW2, and Vga1-SW3 become high sequentially, so that the switch 361 sequentially connects the nodes n0 to n3 to the amplifier 363. The clock signals Vga0-SW0, Vga0-SW1, Vga0-SW2, and Vga0-SW3 are input to the switch 362. The logics of the clock signals Vga0-SW0, Vga0-SW1, Vga0-SW2, and Vga0-SW3 become high sequentially, so that the switch 362 sequentially connects the nodes n0 to n3 to the amplifier 364.

As described above, the periods in which the pulse logics of the clock signals Vga0-SW0, Vga0-SW1, Vga0-SW2, Vga0-SW3, Vag1-SW0, Vga1-SW1, Vga1-SW2, and Vga1-SW3 are high are associated with the periods in which the pulse logics of the clock signals CKSW-0, CKSW-1, CKSW-2, and CKSW-3 are high. Thus, the arithmetic-operation circuit 36 performs the operation described above with reference to FIG. 6.

Thus, the arithmetic-operation circuit 36 performs an operation that is similar to the operation of the arithmetic-operation circuit 26. As a result, since the receiving circuit 30 of the third embodiment has the integration circuit 313 connected in series with the input terminal that receives the data signal 3, the arithmetic-operation circuit 36 connected in series with the integration circuit 313, the ADC circuit 32, and the data determination circuit 35, the receiving circuit 30 has advantages that are similar to those of the receiving circuit 20 of the second embodiment and the receiving circuit 30 of the third embodiment. In addition, since the switches 361 and 362 cause the amplifiers 363 and 364 in the arithmetic-operation circuit 36 to operate in a time-divided manner, the receiving circuit 30 has an advantage in that the number of components thereof is reduced. In addition, since the switches 361 and 362 cause the signals from the amplifiers 363 and 364 to be sequentially output, the receiving circuit 30 has an advantage in that the umber of components of the analog-to-digital conversion circuit in the ADC circuit 32 is reduced.

The arithmetic-operation circuit 26 in the receiving circuit 20 of the second embodiment and the arithmetic-operation circuit 36 in the receiving circuit 30 of the third embodiment change the logic level of the present data signal in accordance with the logic level of the 90° phase-advanced data signal 3, thereby facilitating that the data determination circuits 25 and 35 determine the logic of the data signal 3. The arithmetic-operation circuit, however, may also change the logic level of the present data signal 3 in accordance with the logic level of the 180° phase-advanced data signal 3, instead of the logic level of the 90° phase-advanced data signal 3. Such a configuration can also provide a receiving circuit having the same advantages as those of the receiving circuit 20 of the second embodiment and the receiving circuit 30 of the third embodiment.

Furthermore, the arithmetic-operation circuit may also change the logic level of the present data signal 3 in accordance with both the logic level of the 90° phase-advanced data signal 3 and the logic level of the 180° phase-advanced data signal 3, as in a receiving circuit described below in a fourth embodiment, to configure a receiving circuit having the same advantages.

Fourth Embodiment

Figure 8:
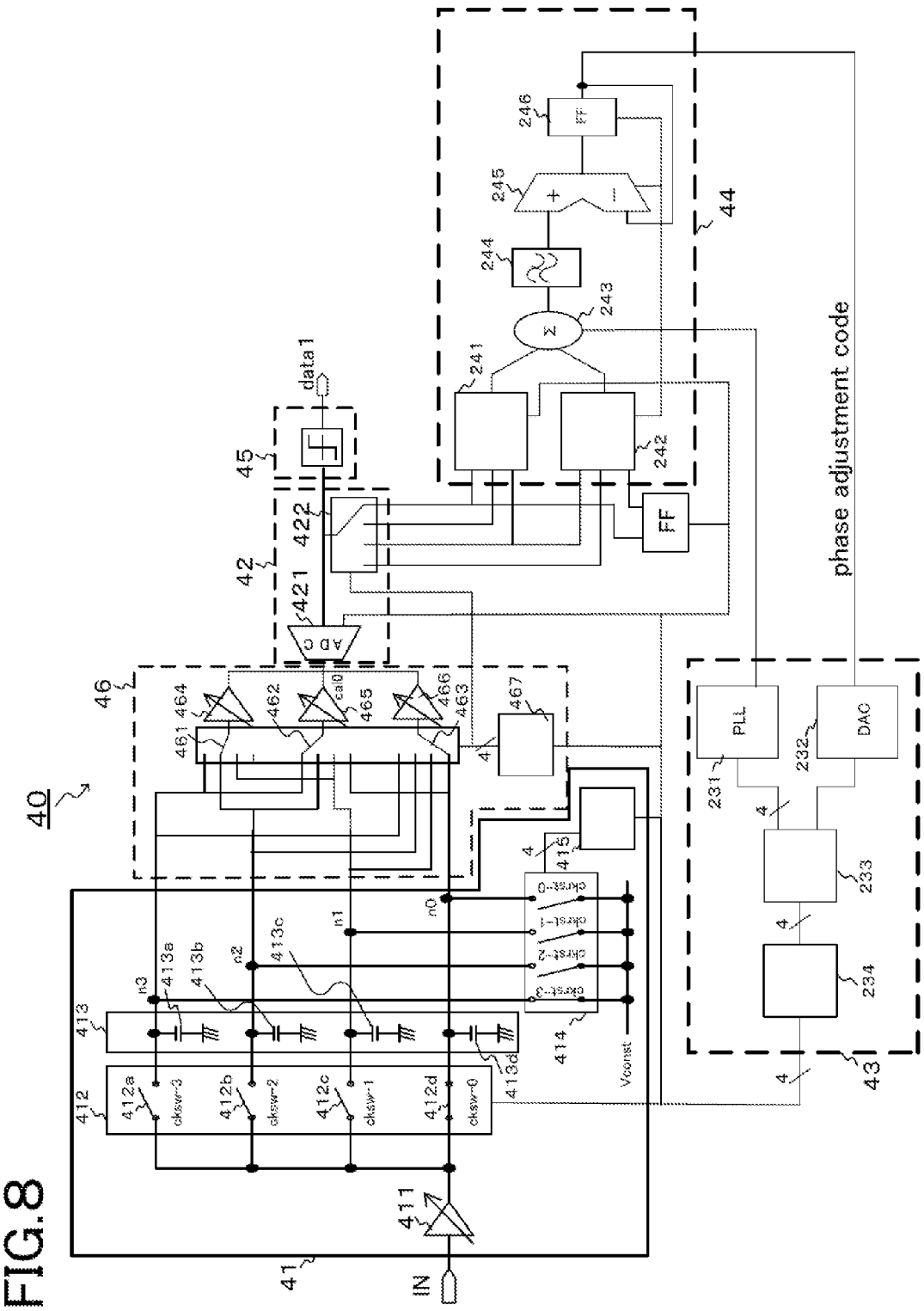
FIG. 8 depicts a receiving circuit according to a fourth embodiment.

FIG. 8 depicts a receiving circuit 40 according to a fourth embodiment. This receiving circuit 40 includes an integration filter 41, an ADC circuit 42, a clock generation circuit 43, a phase detection circuit 44, a data determination circuit 45, and an arithmetic-operation circuit 46.

The clock generation circuit 43 and the phase detection circuit 44 are similar to the clock generation circuit 23 and the phase detection circuit 24, respectively. The data determination circuit 45 is similar to the determination circuit 251.

The integration filter 41 includes a conversion circuit 411, a sampling circuit 412, an integration circuit 413, a reset circuit 414, and a clock generation circuit 415. The integration filter 41 receives a data signal 3 and a clock signal 4 via input terminals.

Similarly to the conversion circuit 211, the conversion circuit 411 supplies current corresponding to the signal level of the data signal 3 input via the corresponding input terminal.

The sampling circuit 412 has a configuration that is similar to that of the sampling circuit 212 and performs operation that is similar to the operation thereof. Thus, the sampling circuit 412 has switches 412a, 412b, 412c, and 412d that are connected or disconnected in accordance with one logic of a four-phase clock signal 435. First ends of the switches 412a, 412b, 412c, and 412d are connected to the same input terminal and second ends of the switches 412a, 412b, 412c, and 412d are connected to respective different output terminals.

The sampling circuit 412 samples the data signal 3 input via the input terminal, in accordance with the four-phase clock signal 435.

The integration circuit 413 is similar to the integration circuit 213, and has four input terminals, four output terminals, four lines, and four capacitance elements 413a, 413b, 413c, and 413d. The four lines connect the input terminals and the output terminals, respectively. The four capacitance elements 413a, 413b, 413c, and 413d are connected to the corresponding lines and have similar capacitances.

The four input terminals are connected to the corresponding switches 412a, 412b, 412c, and 412d on a one-to-one basis. The four output terminals are connected to corresponding four input terminals n0, n1, n2, and n3 of the arithmetic-operation circuit 46 on a one-to-one basis.

The integration circuit 413 integrates the levels of the data signal 3, input via the input terminal, in a pulse period of clocks that constitute the four-phase clock signal 435.

The reset circuit 414 is similar to the reset circuit 214, and has four switches 414a, 414b, 414c, and 414d that connect a ground line and the four output terminals of the integration circuit 413. Each of the switches 414a, 414b, 414c, and 414d is connected or disconnected in response to a four-phase clock signal 416. In response to the four-phase clock signal 435, the clock generation circuit 415 generates the four-clock signal 416 having phases that are different from those of the four-phase clock signal 435.

In a period when the integration of the levels of the data signal 3 input via the input terminal is completed, the reset circuit 414 sequentially releases charges, stored in the four capacitance elements 413a, 413b, 413c, and 413d in the integration circuit 413, to ground, so that the integration circuit 413 is reset.

The ADC circuit 42 has an analog-to-digital circuit 421 and a switch circuit 422. Since the analog-to-digital circuit 421 is similar to the analog-to-digital circuit 321, a description thereof is not given hereinbelow. The switch circuit 422 connects an output terminal of the analog-to-digital circuit 421 and a terminal of the phase detection circuit 44 in response to a four-phase clock signal (constituted by Vga0-SW0, Vga0-SW1, Vga0-SW2, and Vga0-SW3) output from a clock generation circuit 467. The switch circuit 422 outputs signals D0, B0, D0, and B1 so as to correspond to the clock signals Vga0-SW0, Vga0-SW1, Vga0-SW2, and Vga0-SW3, respectively.

The arithmetic-operation circuit 46 has input terminals n0, n1, n2, and n3, an output terminal cal0, amplifiers 464, 465, and 466, switches 461, 462, and 463, and the clock generation circuit 467. Each of the switches 461, 462, and 463 has four input terminals and one output terminal.

The amplifier 464 is connected to the output terminal of the switch 461 and outputs, to the output terminal cal0, a potential level having one-fourth the potential level of the input terminal n0, n1, n2, or n3 and having the same polarity sign.

The amplifier 465 is connected to the output terminal of the switch 462 and outputs, to the output terminal cal0, a potential level having one-half the potential level of the input terminal n0, n1, n2, or n3 and having an opposite polarity sign.

The amplifier 466 is connected to the output terminal of the switch 463 and directly outputs the potential level of the input terminal n0, n1, n2, or n3 to the output terminal cal0.

The switches 461, 462, and 463 repeatedly perform the following operations. In a first operation, the switch 461 connects the input terminal n1 and the amplifier 464, the switch 462 connects the input terminal n0 and the amplifier 465, and the switch 463 connects the input terminal n3 and the amplifier 466. In a second operation, the switch 461 connects the input terminal n2 and the amplifier 464, the switch 462 connects the input terminal n1 and the amplifier 465, and the switch 463 connects the input terminal n0 and the amplifier 466. In a third operation, the switch 461 connects the input terminal n3 and the amplifier 464, the switch 462 connects the input terminal n2 and the amplifier 465, and the switch 463 connects the input terminal n1 and the amplifier 466. In a fourth operation, the switch 461 connects the input terminal n0 and the amplifier 464, the switch 462 connects the input terminal n3 and the amplifier 465, and the switch 463 connects the input terminal n2 and the amplifier 466. The operation then returns to the first operation.

The clock generation circuit 467 outputs the clock signals Vga0-SW0, Vga0-SW1, Vga0-SW2, and Vga0-SW3 for causing the switch 461 to perform connection/disconnection operations as described above. The clock generation circuit 467 also outputs clock signals Vga1-SW0, Vga1-SW1, Vga1-SW2, and Vga1-SW3 for causing the switch 462 to perform connection/disconnection operations as described above. In addition, the clock generation circuit 467 outputs clock signals Vga2-SW0, Vga2-SW1, Vga2-SW2, and Vga2-SW3 for causing the switch 463 to perform connection/disconnection operations as described above.

Figure 9B:
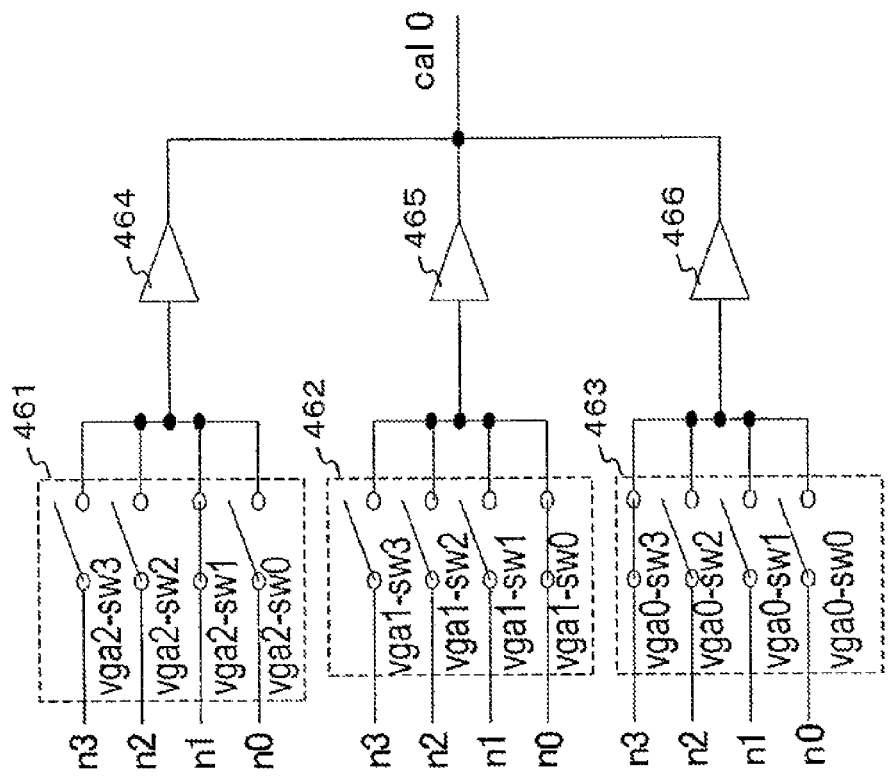
FIGS. 9A and 9B illustrate details of clock signals generated by a clock generation circuit depicted in FIG. 8.
Figure 9A:
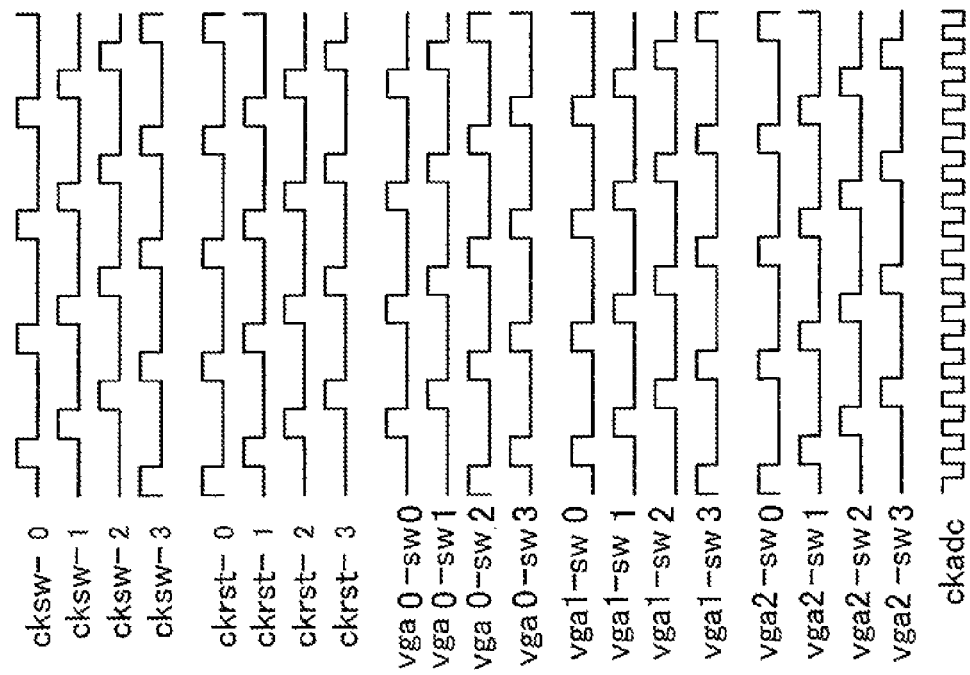

FIGS. 9A and 9B illustrate details of clock signals generated by the clock generation circuit 467. Clock signals CKSW-0, CKSW-1, CKSW-2, CKSW-3, CKRST-0, CKRST-1, CKRST-2, and CKRST-3 depicted in FIG. 9A are similar to those having the same reference characters depicted in FIG. 5A.

The clock signals Vga1-SW0, Vga1-SW1, Vga1-SW2, and Vga1-SW3 are similar to the clock signals CKSW-0, CKSW-1, CKSW-2, and CKSW-3.

The clock signals Vga0-SW0, Vga0-SW1, Vga0-SW2, and Vga0-SW3 have phases that are delayed by 90° from the clock signals CKSW-0, CKSW-1, CKSW-2, and CKSW-3. That is, the times at which the logics of the clock signals Vga0-SW0, Vga0-SW1, Vga0-SW2, and Vga0-SW3 rise from "low" to "high" are delayed by 90° from the times at which the logics of the clock signals CKSW-0, CKSW-1, CKSW-2, and CKSW-3 rise.

The clock signals Vga2-SW0, Vga2-SW1, Vga2-SW2, and Vga2-SW3 have phases that are advanced by 90° relative to the phases of the clock signals CKSW-0, CKSW-1, CKSW-2, and CKSW-3. That is, the times at which the logics of the clock signals Vga0-SW0, Vga0-SW1, Vga0-SW2, and Vga0-SW3 rise from "low" to "high" are advanced by 90° relative to the times at which the logics of the clock signals CKSW-0, CKSW-1, CKSW-2, and CKSW-3 rise.

FIG. 9B depicts the switches 461, 462, and 463 and the amplifiers 464, 465, and 466 included in the arithmetic-operation circuit 46 depicted in FIG. 8. The clock signals Vga2-SW0, Vga2-SW1, Vga2-SW2, and Vga2-SW3 are input to the switch 461. The logics of the clock signals Vga2-SW0, Vga2-SW1, Vga2-SW2, and Vga2-SW3 become high sequentially, so that the switch 461 sequentially connects the nodes n0 to n3 to the amplifier 464. The clock signals Vga1-SW0, Vga1-SW1, Vga1-SW2, and Vga1-SW3 are input to the switch 462. The logics of the clock signals Vga1-SW0, Vga1-SW1, Vga1-SW2, and Vga1-SW3 become high sequentially, so that the switch 462 sequentially connects the nodes n0 to n3 to the amplifier 465. In addition, the clock signals Vga0-SW0, Vga0-SW1, Vga0-SW2, and Vga0-SW3 are input to the switch 463. The logics of the clock signals Vga0-SW0, Vga0-SW1, Vga0-SW2, and Vga0-SW3 become high sequentially, so that the switch 463 sequentially connects the nodes n0 to n3 to the amplifier 466.

As described above, the periods in which the pulse logics of the clock signals Vga0-SW0, Vga0-SW1, Vga0-SW2, and Vga0-SW3, Vga1-SW0, Vga1-SW1, Vga1-SW2, Vga1-SW3, Vga2-SW0, Vga2-SW1, Vga2-SW2, and Vga2-SW3 are high are associated with the periods in which the pulse logics of the clock signals CKSW-0, CKSW-1, CKSW-2, and CKSW-3 are high. Thus, the arithmetic-operation circuit 46 performs the operation described above with reference to FIG. 8.

Thus, the arithmetic-operation circuit 46 changes the logic level of the present data signal in accordance with the logic level of the 90° phase-advanced data signal 3 and the logic level of the 180° phase-advanced data signal 3.

As a result, since the receiving circuit 40 of the fourth embodiment has the integration circuit 413 connected in series with the input terminal that receives the data signal 3, the arithmetic-operation circuit 46 connected in series with the integration circuit 413, the ADC circuit 42, and the data determination circuit 45, the receiving circuit 40 has advantages that are similar to those of the receiving circuit 30 of the third embodiment. In addition, since the switches 461, 462, and 463 cause the amplifiers 464, 465, and 466 in the arithmetic-operation circuit 46 to operate in a time-divided manner, the receiving circuit 40 has an advantage in that the number of components thereof is reduced. In addition, since the switches 461, 462, and 463 cause the signals from the amplifiers 464, 465, and 466 to be sequentially output, the receiving circuit 40 has an advantage in that the number of components of the analog-to-digital circuit 421 in the ADC circuit 42 is reduced.

Since the arithmetic-operation circuit 46 changes the logic level of the present data signal 3 in accordance with the logic level of the 90° phase-advanced data signal 3 and the logic level of the 180° phase-advanced data signal 3, there is the advantage of making it easier to perform logic determination of the data signal 3.

Fifth Embodiment

Figure 10:
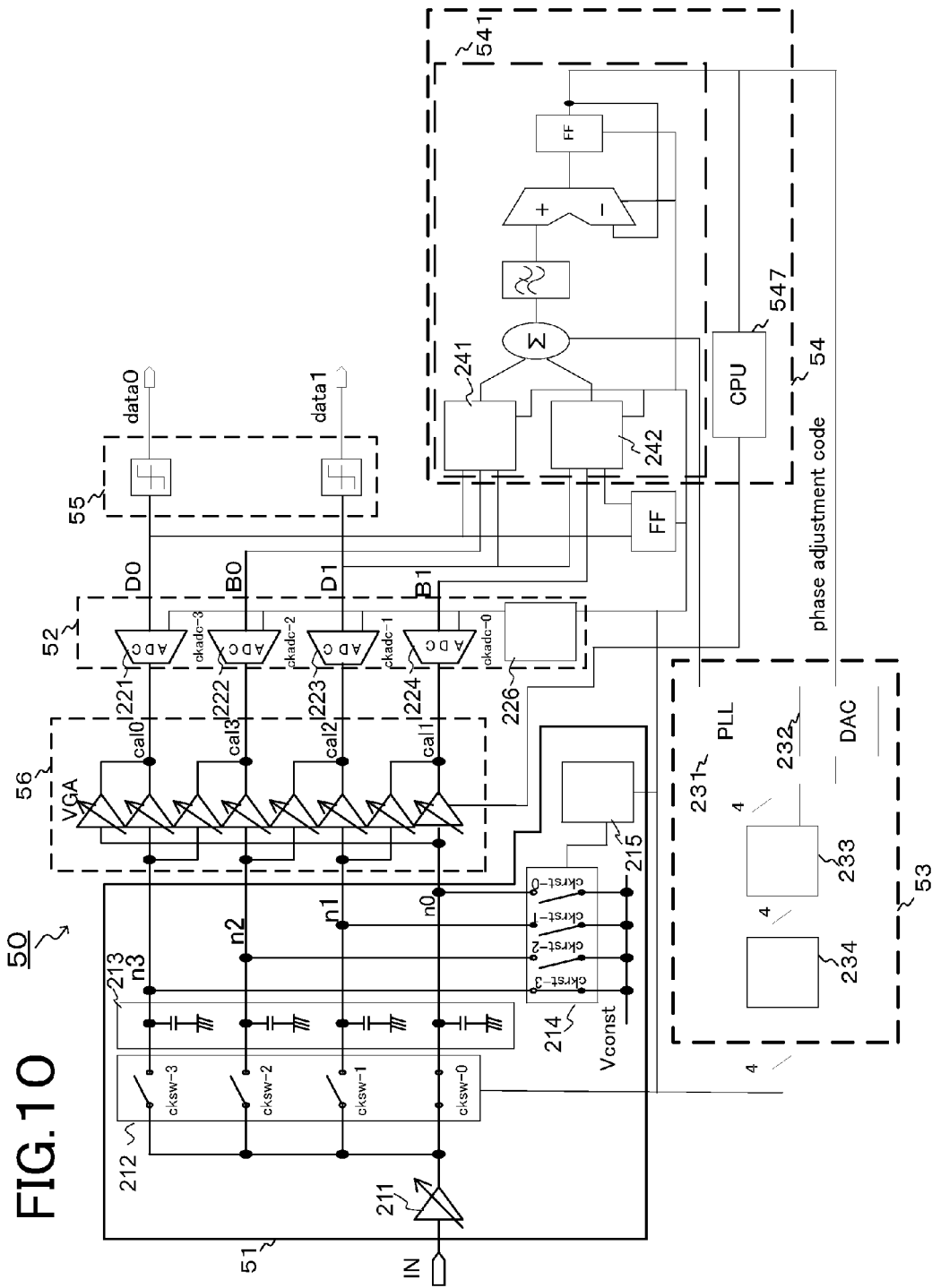
FIG. 10 depicts a receiving circuit according to a fifth embodiment.

FIG. 10 depicts a receiving circuit 50 according to a fifth embodiment. This receiving circuit 50 includes an integration filter 51, an ADC circuit 52, a clock generation circuit 53, a phase detection circuit 54, a data determination circuit 55, and an arithmetic-operation circuit 56.

The integration filter 51, the ADC circuit 52, the clock generation circuit 53, and the data determination circuit 55 are similar to the integration filter 21, the ADC circuit 22, the clock generation circuit 23, and the data determination circuit 25 in the second embodiment, and thus descriptions thereof are not given hereinbelow.

The phase detection circuit 54 includes a phase detection circuit 541 and a CPU (central processing unit) 547.

The phase detection circuit 541 is similar to the phase detection circuit 24 in the second embodiment, and thus a description thereof is not given hereinbelow.

The CPU 547 receives a phase adjustment code from the phase detection circuit 541. In accordance with the phase adjustment code, the CPU 547 determines, for an arithmetic operation performed by the arithmetic-operation circuit 56, a rate of feedback from the logic level of the 90° phase-advanced data signal.

The arithmetic-operation circuit 56 outputs a signal having a logic level (V(cal1)) of the node cal1, the logic level being obtained by performing an arithmetic operation given by the equation below on a logic level (V(n0)) of the node n0 and a logic level (V(n1)) of the node n1.

$$V(cal1)=V(n1)-\alpha V(n0),$$

where α is a positive constant that is smaller than or equal to 1 and indicates the feedback rate determined by the CPU 547. The arithmetic-operation circuit 56 also outputs a signal having a logic level (V(Cal2)) of the node Cal2, the logic level being obtained by performing an arithmetic operation as noted above on the logic level (V(n1)) of the node n1 and a logic level (V(n2)) of the node n2. The arithmetic-operation circuit 56 further outputs a signal having a logic level (V(Cal3)) of the node Cal3, the logic level being obtained by performing an arithmetic operation as noted above on the logic level (V(n2)) of the node n2 and a logic level (V(n3)) of the node n3. The arithmetic-operation circuit 56 further outputs a signal having a logic level (V(Cal0)) of the node Cal0, the logic level being obtained by performing an arithmetic operation as noted above on the logic level (V(n3)) of the node n3 and the logic level (V(n0)) of the node n0.

That is, amplifiers 562, 564, 566, and 568 included in the arithmetic-operation circuit 56 directly output the logic levels of the nodes n3, n2, n1, and n0 to the nodes cal0, cal3, cal2, and cal1, respectively. On the other hand, amplifiers 561, 563, 565, and 567 included in the arithmetic-operation circuit 56 output logic levels that are −α times the logic levels of the nodes n3, n2, n1, and n0 to the nodes Cal0, Cal3, Cal2, and Cal1, respectively.

According to the receiving circuit 50 of the fifth embodiment, the arithmetic-operation circuit 56 changes the logic level of the present data signal 3 in accordance with the logic level of the 90° phase-advanced data signal 3, thus providing an advantage in that the logic of the data signal 3 can be more easily determined.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving circuit comprising:
a clock generation circuit that generates four clock signals having respective pulse periods of 90 degrees, the pulse periods being different from each other by 90 degrees and one cycle being associated with 360 degrees;
an integration filter that generates a first storage potential, a second storage potential, a third storage potential, and a fourth storage potential based on potentials of an input signal in the corresponding pulse periods of the clock signals;
an arithmetic-operation circuit that generates an arithmetic-operation potential by performing an arithmetic operation on two selected ones of the first storage potential, the second storage potential, the third storage potential, and the fourth storage potential;
an analog-to-digital circuit that converts the arithmetic-operation potential into a digital value; and
a data determination circuit that determines a logic of the input signal on a basis of the digital value, wherein the arithmetic-operation potential generated by the arithmetic-operation circuit comprises a first arithmetic-operation potential, a second arithmetic-operation potential, a third arithmetic-operation potential, and a fourth arithmetic-operation potential, each arithmetic-operation potential being obtained by performing an arithmetic operation on a combination of two different ones of the first storage potential, the second storage potential, the third storage potential, and the fourth storage potential;
the digital value comprises a first arithmetic-operation digital value, a second arithmetic-operation digital value, a third arithmetic-operation digital value, and a fourth arithmetic-operation digital value corresponding to the first arithmetic-operation potential, the second arithmetic-operation potential, the third arithmetic-operation potential, and the fourth arithmetic-operation potential;

the receiving circuit further comprises a phase detection circuit that detects a difference of phases of the clock signals relative to a phase of the input signal on a basis of the first arithmetic-operation digital value, the second arithmetic-operation digital value, and the third arithmetic-operation digital value or on a basis of the first arithmetic-operation digital value, the third arithmetic-operation digital value, and the fourth arithmetic-operation digital value and that outputs an information signal having a logic corresponding to the phase difference; and the clock generation circuit adjusts the phases of the clock signals in accordance with the information signal.

2. A receiving circuit comprising:

a clock generation circuit that generates four clock signals having respective pulse periods of 90 degrees, the pulse periods being different from each other by 90 degrees and one cycle being associated with 360 degrees;

an integration filter that generates a first storage potential, a second storage potential, a third storage potential, and a fourth storage potential based on potentials of an input signal in the corresponding pulse periods of the clock signals;

an arithmetic-operation circuit that generates an arithmetic-operation potential by performing an arithmetic operation on two selected ones of the first storage potential, the second storage potential, the third storage potential, and the fourth storage potential;

an analog-to-digital circuit that converts the arithmetic-operation potential into a digital value;

a data determination circuit that determines a logic of the input signal on a basis of the digital value;

a first amplifier that generates a potential having a regular polarity by amplifying a potential, the first amplifier having a first gain; and a second amplifier that generates a potential having an inverted polarity, the second amplifier having a second gain that is smaller than the first gain, wherein a first one of the two selected ones of the first storage potential, the second storage potential, the third storage potential, and the fourth storage potential, the first one being obtained in accordance with the clock signal having a delayed phase, is input to the first amplifier and a second one of the two selected ones is input to the second amplifier, and the potential generated by the first amplifier and the potential generated by the second amplifier are added to obtain the arithmetic-operation potential.

3. The receiving circuit according to claim 2, wherein the first gain is determined in accordance with the difference of the phases of the clock signals relative to the phase of the input signal.

4. A receiving circuit comprising:

a clock generation circuit that generates four clock signals having respective pulse periods of 90 degrees, the pulse periods being different from each other by 90 degrees and one cycle being associated with 360 degrees;

an integration filter that generates a first storage potential, a second storage potential, a third storage potential, and a fourth storage potential based on potentials of an input signal in the corresponding pulse periods of the clock signals;

an arithmetic-operation circuit that generates an arithmetic-operation potential by performing an arithmetic operation on two selected ones of the first storage potential, the second storage potential, the third storage potential, and the fourth storage potential;

an analog-to-digital circuit that converts the arithmetic-operation potential into a digital value;

a data determination circuit that determines a logic of the input signal on a basis of the digital value;

a first amplifier that generates a potential having a regular polarity by amplifying a potential, the first amplifier having a first gain; and a second amplifier that generates a potential having an inverted polarity, the second amplifier having a second gain that is smaller than the first gain;

a first switch that connects one of the first storage potential, the second storage potential, the third storage potential, and the fourth storage potential to the first amplifier, the first storage potential, the second storage potential, the third storage potential, and the fourth storage potential being obtained by storing signal potentials of the input signal in the pulse period of the clock signal of interest, the clock signal of interest being included in the four clock signals; and a second switch that connects one of the first storage potential, the second storage potential, the third storage potential, and the fourth storage potential to the second amplifier, the first storage potential, the second storage potential, the third storage potential, and the fourth storage potential being obtained by storing signal potentials of the input signal in accordance with the clock signal having the pulse period that is 90 degrees behind the pulse period of the clock signal of interest;

wherein a potential obtained by the adding the potential generated by the first amplifier and the potential generated by the second amplifier is output.

5. A receiving circuit comprising:

a clock generation circuit that generates four clock signals having respective pulse periods of 90 degrees, the pulse periods being different from each other by 90 degrees and one cycle being associated with 360 degrees;

an integration filter that generates a first storage potential, a second storage potential, a third storage potential, and a fourth storage potential based on potentials of an input signal in the corresponding pulse periods of the clock signals;

an arithmetic-operation circuit that generates an arithmetic-operation potential by performing an arithmetic operation on two selected ones of the first storage potential, the second storage potential, the third storage potential, and the fourth storage potential;

an analog-to-digital circuit that converts the arithmetic-operation potential into a digital value;

a data determination circuit that determines a logic of the input signal on a basis of the digital value;

a first amplifier that generates a potential having a regular polarity by amplifying a potential, the first amplifier having a first gain;

a second amplifier that generates a potential having an inverted polarity, the second amplifier having a second gain that is smaller than the first gain; and a third amplifier that generates a potential having a regular polarity, the third amplifier having a third gain that is smaller than the second gain;

a first switch that connects one of the first storage potential, the second storage potential, the third storage potential, and the fourth storage potential to the first amplifier, the first storage potential, the second storage potential, the third storage potential, and the fourth storage potential being obtained by storing signal potentials of the input signal in the pulse period of the clock signal of interest, the clock signal of interest being included in the four clock signals;

a second switch that connects one of the first storage potential, the second storage potential, the third storage potential, and the fourth storage potential to the second amplifier, the first storage potential, the second storage potential, the third storage potential, and the fourth storage potential being obtained by storing signal potentials of the input signal in accordance with the clock signal having the pulse period that is 90 degrees ahead of the pulse period of the clock signal of interest; and a third switch that connects one of the first storage potential, the second storage potential, the third storage potential, and the fourth storage potential to the third amplifier, the first storage potential, the second storage potential, the third storage potential, and the fourth storage potential being obtained by storing signal potentials of the input signal in accordance with the clock signal having the pulse period that is 180 degrees ahead of the pulse period of the clock signal of interest;

wherein a potential obtained by adding the potential generated by the first amplifier, the potential generated by the second amplifier, and the potential generated by the third amplifier is output.

* * * * *